United States Patent [19]
Murphy et al.

[11] Patent Number: 4,764,690
[45] Date of Patent: Aug. 16, 1988

[54] ELECTRET TRANSDUCING

[75] Inventors: Preston V. Murphy; Kurt Hübschi, both of Geneva, Switzerland

[73] Assignee: Lectret S.A., Geneva, Switzerland

[21] Appl. No.: 875,596

[22] Filed: Jun. 18, 1986

[51] Int. Cl.[4] .......................... G11C 13/02; H04R 19/00

[52] U.S. Cl. .......................... 307/400; 381/191; 29/594; 29/631.1

[58] Field of Search .......................... 307/400; 381/191; 29/592 E, 594

[56] References Cited

U.S. PATENT DOCUMENTS

| | | | |
|---|---|---|---|
| 3,436,492 | 4/1969 | Reedyk | 381/191 X |
| 3,772,133 | 11/1973 | Schmitt | 307/400 X |
| 3,943,304 | 3/1976 | Piribauer | 381/191 X |
| 3,963,881 | 6/1976 | Fram et al. | 381/191 X |
| 4,014,091 | 3/1977 | Rodera et al. | 381/191 X |
| 4,063,050 | 12/1977 | Carlson et al. | 381/191 X |
| 4,160,881 | 7/1979 | Smulders | 381/191 X |
| 4,236,051 | 11/1980 | Nakagawa et al. | 381/191 X |
| 4,249,043 | 2/1981 | Morgan et al. | 381/191 X |
| 4,268,725 | 5/1981 | Nakagawa et al. | 381/191 X |
| 4,331,840 | 5/1982 | Murphy et al. | 381/191 X |
| 4,418,246 | 11/1983 | Sawyer | 381/191 X |
| 4,442,324 | 4/1984 | Blanchard et al. | 307/400 X |
| 4,447,678 | 5/1984 | Fidi | 381/191 X |
| 4,542,264 | 9/1985 | Schmidt et al. | 381/191 X |
| 4,567,382 | 1/1986 | van Halteren | 307/400 |
| 4,621,171 | 11/1986 | Wada et al. | 381/191 X |

*Primary Examiner*—William M. Shoop, Jr.
*Assistant Examiner*—Sharon D. Logan

[57] ABSTRACT

A backplate assembly for an electret transducer including a backplate, an electret layer covering one surface of the backplate, and a peripheral spacer on the same side of the backplate as the electret layer and around the entire periphery of the electret layer, the spacer being secured to the backplate by a thin layer of material of the electret layer located and compressed between the spacer and the backplate, the thin layer being substantially thinner than the electret layer. Also disclosed is using a peripheral ring to support a diaphragm spaced from a housing wall via support members extending from the ring.

16 Claims, 1 Drawing Sheet

ELECTRET TRANSDUCING

FIELD OF THE INVENTION

This invention relates to acoustic transducers, for example, electret condenser microphones.

BACKGROUND OF THE INVENTION

It is known that extremely precise control of the distance between backplate and diaphragm is very important in an electret microphone. Desirably, variation in the distance from unit to unit should be less than two microns, the distance itself typically being in the range of from 25 to 40 microns.

Techniques heretofore proposed for controlling this distance, or separation, or spacing, have included protrusions (Schmitt U.S. Pat. No. 3,772,133, dated Nov. 13, 1973), a screen (Smulders U.S. Pat. No. 4,160,881, dated July 10, 1979), and directly securing a spacer to a Teflon electret layer on a backplate by heating, the spacer itself being spaced from the backplate by the thickness of the Teflon layer.

In hearing aid microphones the sound entry port is usually on a narrow edge of the microphone rather than the front face, and the diaphragm is supported on a ring or bonded to the backplate. In order to provide an unobstructed path from the entry port to the diaphragm, so called acoustic terminators (e.g, U.S. Pat. No. 4,331,840) or deformations in the housing (e.g., U.S. Pat. No. 4,160,881) have been used.

The electret microphones used in hearing aids have used hybrid rather than monolithic preamplifiers, because only the former were able to provide sufficiently low noise, low current drain, and low operating voltage (pinch-off voltage 0.3 to 0.7 volt). Recently, monolithic JFET preamplifiers have been proposed for hearing aids.

SUMMARY OF THE INVENTION

In one aspect our invention features applying high pressure and increased temperature to a backplate/electret layer/peripheral spacer sandwich to cause the electret layer material to flow out of the region between the spacer and the backplate so that the spacer is virtually bottomed out on the backplate. The high pressure permits a sufficiently thin layer of electret such that any variation in thickness is insignificant in relation to overall spacing, and provides a burr-free spacer surface, thereby providing accurately reproducible spacer height. The effective spacer height is the difference between height of the spacer minus thickness of electret layer.

In preferred embodiments the electret layer is made of Teflon 25 microns in thickness; the backplate has a protrusion on the same side as the spacer of about the same height; the spacer is 50 microns in thickness (most preferably greater than 40 microns); the thickness of material between the spacer and the backplate is less than 2 microns (most preferably 1 micron); so that electret:diaphragm spacing is 26 microns.

In another aspect the invention features supporting the diaphragm on one side of a peripheral ring that includes support members extending from the opposite side so as to space the ring from the housing wall at the same time that an unobstructed path is provided to the diaphragm, which makes possible providing the entry port in either an edge or a bottom wall of the microphone housing.

In preferred embodiments the support members are a pair of parallel bars extending between and spaced from opposite portions of the ring; the parallel bars are spaced from each other by a distance greater than the width of the path from the entry port to the region opposite the diaphragm; and the housing for the electret transducer has a side opening.

In another aspect the invention features an electret transducer with a preamplifier including a PMOS metal-oxide-semiconductor transistor. The preamplifier is reliable and simply and inexpensively made. In preferred embodiments the substrate supporting the transistor also includes a polysilicon gate, a polysilicon gate bias resistor and a source resistor.

Other advantages and features of the invention will be apparent from the following description of a preferred embodiment thereof and from the claims.

PREFERRED EMBODIMENTS

The preferred embodiment will now be described.

Drawings

Structure

Figure 1:
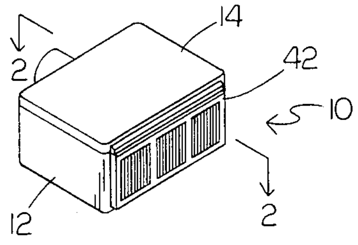
FIG. 1 is a perspective view of an electret transducer according to the invention.
Figure 2:
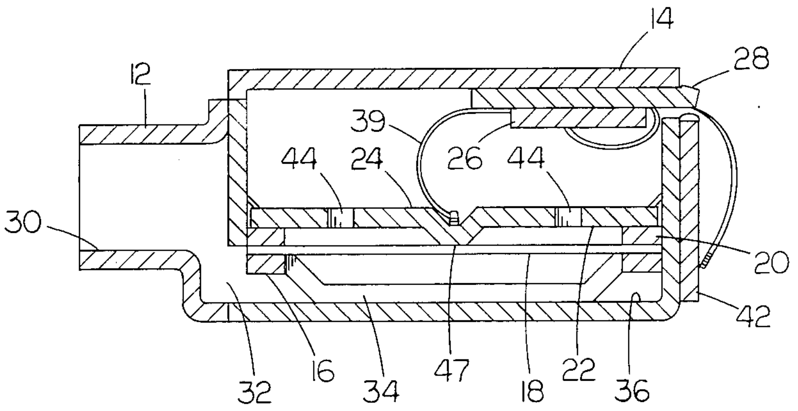
FIG. 2 is a vertical sectional view, taken at 2—2 of FIG. 1, of the FIG. 1 transducer.
Figure 3:
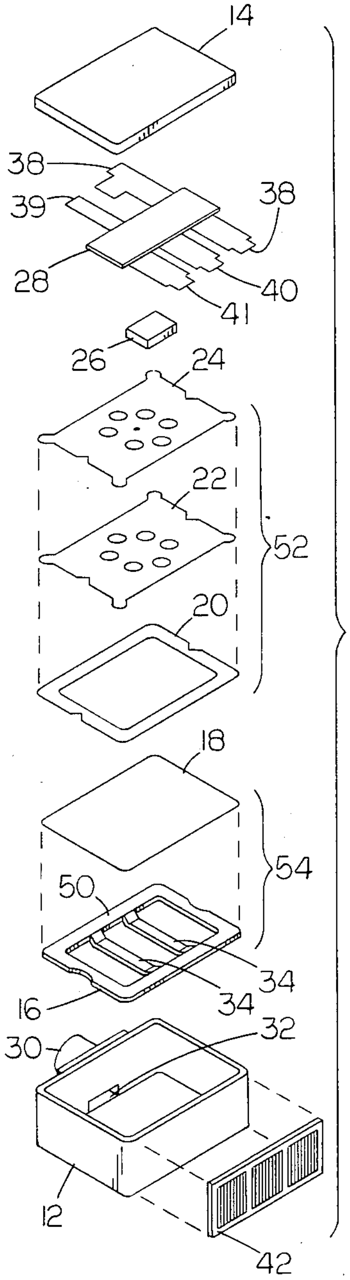
FIG. 3 is an exploded perspective view of the FIG. 1 transducer.

Referring to FIGS. 1 through 3, there is shown transducer 10 including lower housing 12 and cover 14 in which the transducer components are contained. They include diaphragm support 16, diaphragm 18, 50 micron-thick spacer ring 20, 25 micron-thick Teflon electret 22, metal backplate 24, preamplifier 26, and printed circuit board 28. Lower housing 12 has entry port 30 extending from one side thereof and connected to the region below diaphragm 18 via passage 32 between lower parallel bars 34 of diaphragm support 16, which bars space diaphragm 18 above lower housing wall 36. Printed circuit board 28 is supported by the lower surface of cover 14 and has contact 39 making electrical connection with backplate 24 and contacts 38, 40, 41 connected to one of spaced copper soldering terminals carried on insulating material (indicated as a group at 42) adhered to housing 12. Backplate 24 has holes 44 to the region between it and diaphragm 18 and protuberance 47 of height to just touch diaphragm 18.

Figure 5:
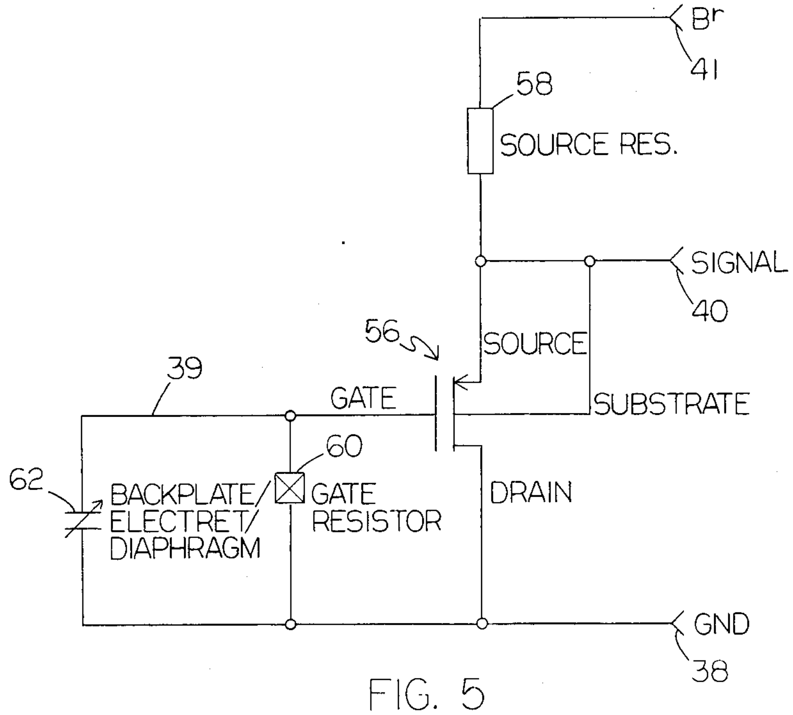
FIG. 5 is an electrical schematic of a preamplifier of the FIG. 1 transducer.

Referring to FIG. 5, PMOS preamplifier 26 includes polysilicon p-channel metal-oxide-semiconductor transistor 56 manufactured according to CMOS technology. The source of transistor 56 is directly connected to signal contact 40 and connected through 10–20K ohm source resistor 58 on semiconductor substrate of transistor 56 to power source lead 41. The gate of transistor 26 is connected to polysilicon $10^9$ to $10^{10}$ ohm gate resistor 60, and by contact 39 to backplate 24, shown diagrammatically in FIG. 5 as part of variable capacitor 62, representing the electret/diaphragm combination. As indicated in FIG. 5, diaphragm 18 is connected to ground 38, as are the drain of transistor 56 and gate resistor 60.

Manufacture

Figure 4:
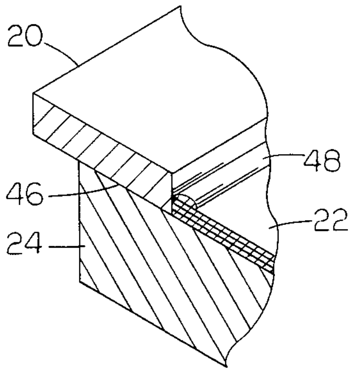
FIG. 4 is a partial view of a backplate/electret/spacer component of the FIG. 1 transducer along with an enlarged view of a portion thereof.
Figure 4A:
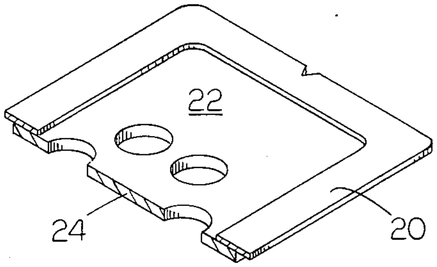

Backplate 24, Teflon electret layer 22, and spacer ring 20 are assembled together by applying very high bonding pressure (about six kilograms per square millimeter) and elevated tempeature (320° C.) to a sandwich of sheets carrying pluralities of the components spaced from adjacent components by breakout tabs (not shown). Sufficient pressure is applied to cause the Teflon material to be forced out of the region between ring 20 and backplate 24 so that approximately 1 micron thick layer 46 remains, the displaced Teflon appearing as ridge 48 (exaggerated in enlarged portion of FIG. 4) near spacer ring 20. The use of the high pressure acts to provide otherwise difficult adhesion of spacer 20 to Teflon, and provides a burrfree surface for spacer 20, resulting in an accurately reproducible spacer height.

Diaphragm 18 is secured to peripheral ring 50 of diaphragm support 16 by adhesive that is applied to the upper surface of ring 50 and cured after diaphragm 18 has been placed under tension and brought into contact with the adhesive. Backplate spacer subassembly 52 is then bonded to diaphragm subassembly 54 using a very thin bead of low viscosity adhesive to avoid significantly increasing the spacing between diaprhagm 18 and backplate 24.

Operation

In use, sound waves enter through port 30 and pass into the region opposite diaphragm 18 with little attenuation of the higher frequencies owing to the use of spaced parallel bars 34. Bars 34 rest securely against lower housing wall 36 and also add to the rigidity of diaphragm support 16.

The sound waves cause variations in the distance between diaphragm 18 and electret layer 22, varying the capacitance of the resultant variable capacitor 62 (FIG. 5) (18, 22), providing a signal amplified by transistor 56 provided over contact 40. Spacer 20 provides accurate spacing of diaphragm 18 from backplate 24, resulting in desirably low dispersion in the sensitivity level, a problem with electret microphones.

Transistor 56 has low noise, low current drain, and low operating voltage. Its pinch-off voltage ($V_p$) is between 0.4 and 0.6 volt; its current drain at 1.3 volts is 20–30 microamps; its noise level is approximately 4 microvolts average "A" weighted; its input capacitance is 4 pF, providing with the electret's 3–4 pF driving capacitance a desirable signal-to-noise ratio of 24 dB. Preamplifier chip 26 has good resistance to high temperature and high humidity.

Other Embodiments

Other embodiments of the invention are within the scope of the following claims. E.g, the entry port could be provided through lower housing wall 36.

What is claimed is:

1. A backplate assembly for an electret transducer comprising
   - a backplate,
   - an electret layer covering one surface of said backplate, and
   - a peripheral spacer on the same side of the backplate as said electret layer and around the entire periphery of said electret layer, said spacer being secured to said backplate by a thin layer of material of said electret layer located and compressed between said spacer and said backplate, said thin layer being substantially thinner than said electret layer.

2. The assembly of claim 1 wherein said spacer can move no further than said backplate resulting in an effective spacer height equal to the height of said spacer minus the thickness of said electret layer.

3. The assembly of claim 1 wherein said electret layer is made of Teflon.

4. The assembly of claim 1 wherein said thin layer is 2 microns or less in thickness, and said spacer is greater than 25 microns thick.

5. The assembly of claim 4 wherein said thin layer is less than or equal to 1 micron thick, and said spacer is more than 40 microns thick.

6. A method of making a backplate assembly comprising
   - providing a sandwich of a backplate, an electret layer covering one surface of said backplate, and a peripheral spacer on the same side of the backplate as said electret and around the entire periphery of said electret layer, and
   - applying sufficient pressure and temperature to cause the majority of electret layer material between said spacer and said backplate to be displaced outward, resulting in a very thin layer between said spacer and said backplate.

7. The method of claim 6 wherein said pressure is sufficiently high such that further increases in pressure do not result in a substantially thinner layer between the spacer and backplate.

8. The method of claim 7 wherein said electret layer is made of Teflon.

9. The method of claim 7 wherein said thin layer is 2 microns or less in thickness, and said spacer is greater than 25 microns thick.

10. The method of claim 8 wherein said thin layer is less than or equal to 1 micron thick, and said spacer is more than 40 microns thick.

11. A transducer including a backplate assembly comprising
    - a backplate,
    - an electret layer covering one surface of said backplate,
    - a peripheral spacer on the same side of the backplate as said electret layer and around the entire periphery of said electret layer, said spacer being secured to said backplate by a thin layer of material of said electret layer compressed between said spacer and said backplate, said thin layer being substantially thinner than said electret layer, and
    - a diaphragm spaced from said backplate by said spacer.

12. An electret transducer comprising
    - a housing defining an entry port to a chamber therein,
    - a diaphragm in said chamber, and
    - a diaphragm support including a pheripheral ring, one side of said ring being secured to said diaphragm and another side of said ring being secured to support members, said support members spacing said ring from a wall of said housing and providing an unobstructed path between said port and said diaphragm.

13. The transducer of claim 12 wherein said support members are a pair of parallel bars extending between and spaced from said ring.

14. The transducer of claim 13 wherein said bars are spaced from each other by a distance greater than the width of said entry port.

15. The transducer of claim 14 wherein said housing has large sides parallel to said diaphragm and thin sides perpendicular to said large sides, and said entry port is located at a thin side of said housing.

16. The transducer of claim 14 wherein said entry port directly faces said diaphragm.

* * * * *